United States Patent
Yamawaki et al.

(10) Patent No.: US 12,288,115 B2
(45) Date of Patent: Apr. 29, 2025

(54) WIRELESS COMMUNICATION DEVICE MANUFACTURING SYSTEM

(71) Applicant: Murata Manufacturing Co., Ltd., Nagaokakyo (JP)

(72) Inventors: Yoshinori Yamawaki, Nagaokakyo (JP); Noboru Kato, Nagaokakyo (JP); Ryosuke Washida, Nagaokakyo (JP); Yoshiki Aburatani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/309,117

(22) Filed: Apr. 28, 2023

(65) Prior Publication Data

US 2023/0267297 A1 Aug. 24, 2023

Related U.S. Application Data

(63) Continuation of application No. PCT/JP2022/022967, filed on Jun. 7, 2022.

(30) Foreign Application Priority Data

Jul. 2, 2021 (JP) ................. 2021-110794
Oct. 8, 2021 (JP) ................. 2021-166039

(51) Int. Cl.
*G06K 19/07* (2006.01)
*G06K 19/077* (2006.01)
(Continued)

(52) U.S. Cl.
CPC .......... *G06K 19/077* (2013.01); *H05K 3/341* (2013.01); *H05K 13/04* (2013.01)

(58) Field of Classification Search
CPC ....... G06K 19/077; H05K 3/341; H05K 13/04
(Continued)

(56) References Cited

U.S. PATENT DOCUMENTS

2007/0007344 A1* 1/2007 Inoue ................. G06K 19/0775
235/435
2019/0138871 A1 5/2019 Kato
(Continued)

FOREIGN PATENT DOCUMENTS

CN 110503177 A1 11/2019
JP 2008107947 A1 5/2008
(Continued)

OTHER PUBLICATIONS

International Search Report in PCT/JP2022/022967, mailed Aug. 30, 2022, 3 pages.

*Primary Examiner* — Daniel A Hess
(74) *Attorney, Agent, or Firm* — ArentFox Schiff LLP

(57) ABSTRACT

A wireless communication device manufacturing system includes: a mounting apparatus including a mounting head mounted with a suction nozzle that sucks and holds an RFIC module including an RFIC chip, a terminal electrode, and a hot melt adhesive layer; a conveyance apparatus configured to convey the antenna base material including an antenna pattern to a mounting position; and a heating apparatus configured to heat the hot melt adhesive layer of the RFIC module. The wireless communication device manufacturing system bonds the RFIC module in a state where the hot melt adhesive layer is softened by heating of the heating apparatus to the antenna base material disposed at the mounting position through the hot melt adhesive layer, and capacitively couples the antenna pattern and the terminal electrode through the hot melt adhesive layer.

12 Claims, 9 Drawing Sheets

(51) Int. Cl.
*H05K 3/34* (2006.01)
*H05K 13/04* (2006.01)

(58) Field of Classification Search
USPC .......................................... 235/492
See application file for complete search history.

(56) References Cited

U.S. PATENT DOCUMENTS

| | | |
|---|---|---|
| 2021/0227737 A1 | 7/2021 | Yamawaki et al. |
| 2021/0350199 A1 | 11/2021 | Yamawaki et al. |
| 2023/0033357 A1 | 2/2023 | Yamawaki et al. |

FOREIGN PATENT DOCUMENTS

| | | | |
|---|---|---|---|
| JP | 2013171429 A1 | 9/2013 | |
| JP | 2021180447 A1 | 11/2021 | |
| WO | 2018012391 A1 | 1/2018 | |
| WO | 2019077926 A1 | 4/2019 | |
| WO | 2020079961 A1 | 4/2020 | |
| WO | 2020152915 A1 | 7/2020 | |
| WO | 2021210535 A1 | 10/2021 | |

\* cited by examiner

WIRELESS COMMUNICATION DEVICE MANUFACTURING SYSTEM

CROSS REFERENCE TO RELATED APPLICATIONS

This application is a continuation of PCT Application No. PCT/JP2022/022967, filed Jun. 7, 2022, which claims priority to Japanese Patent Application No. 2021-110794, filed Jul. 2, 2021, and Japanese Patent Application No. 2021-166039, filed Oct. 8, 2021, the entire contents of each of which are hereby incorporated in their entirety.

TECHNICAL FIELD

Aspects of the present disclosure are directed to a manufacturing system of a wireless communication device.

BACKGROUND OF THE INVENTION

PCT/JP2017/024781, WO2018/012391 ("WO '391") discloses a method for manufacturing an RFID tag (e.g., wireless communication device) in which a base film (e.g., antenna base material) provided with an antenna pattern is conveyed toward a mounting position, and a radio-frequency integrated circuit (e.g., RFIC) element (e.g., RFIC module) with seal is attached to the antenna pattern at the mounting position. The RFIC element with seal attached to a tape is picked up, and the picked-up RFIC element with seal is attached (e.g., fixed) to the antenna pattern.

In the case of the manufacturing method described in WO '391, since may be necessary to peel off and pick up the RFIC element with seal from the tape, it takes time for the picking up. In addition, there is a case where picking up of the RFIC element fails.

SUMMARY OF THE INVENTION

Accordingly, it is an object of the present disclosure to provide a wireless communication device including an RFIC module including an RFIC chip, and an antenna pattern, to easily and reliably pick up the RFIC module and adhere the RFIC module to an antenna base material provided with the antenna pattern.

According to one aspect of the present disclosure, provided is a wireless communication device manufacturing system that includes: a mounting apparatus including a mounting head mounted with a suction nozzle that sucks and holds a radio-frequency integrated circuit ("RFIC") module; a conveyance apparatus configured to convey an antenna base material to a mounting position; and a heating apparatus configured to heat a hot melt adhesive layer of the RFIC module. The wireless communication device manufacturing system bonds the RFIC module in a state where the hot melt adhesive layer is softened by heating of the heating apparatus to the antenna base material disposed at the mounting position through the hot melt adhesive layer, and capacitively couples an antenna pattern and a terminal electrode through the hot melt adhesive layer.

Accordingly, it is an object of the present disclosure to provide in a wireless communication device including an RFIC module including an RFIC chip, and an antenna pattern, it is possible to easily and reliably pick up the RFIC module and adhere the RFIC module to an antenna base material provided with the antenna pattern.

Additional advantages and novel features of the system of the present disclosure will be set forth in part in the description that follows, and in part will become more apparent to those skilled in the art upon examination of the following or upon learning by practice of the disclosure

BRIEF DESCRIPTION OF THE DRAWINGS

In the descriptions that follow, like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings.

DETAILED DESCRIPTION

Figure 1:
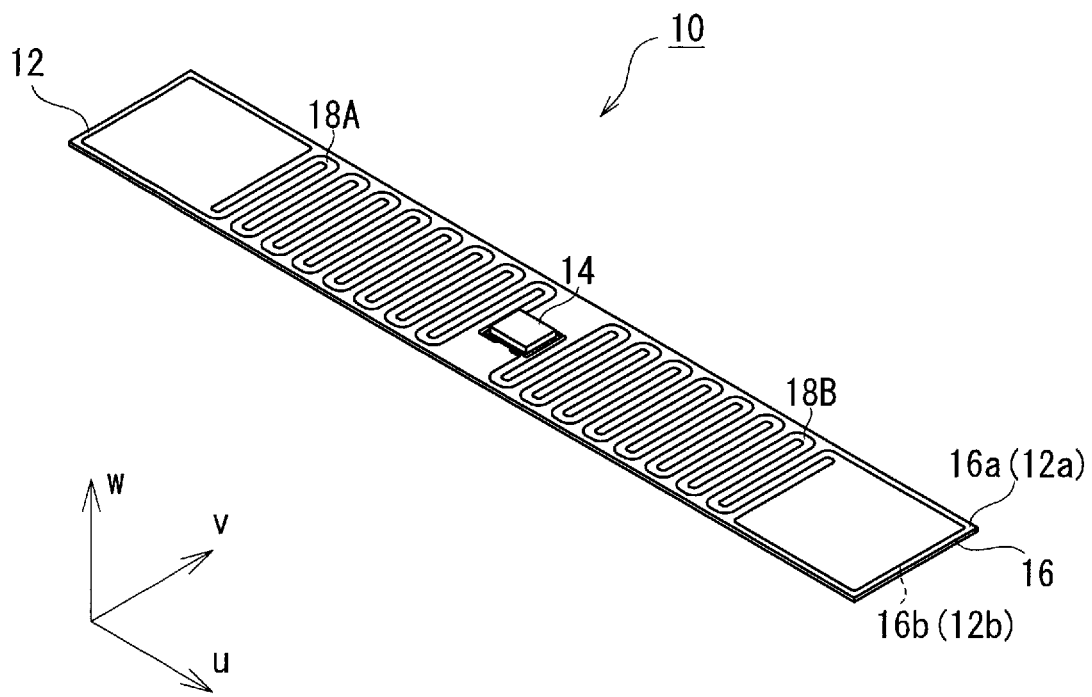
FIG. 1 is a perspective view of an example of a wireless communication device to be manufactured by a wireless communication device manufacturing system in accordance with aspects of the present disclosure.

A wireless communication device manufacturing system according to an aspect of the present disclosure is a wireless communication device manufacturing system for bonding an RFIC module including an RFIC chip, a terminal electrode, and a hot melt adhesive layer to an antenna base material including an antenna pattern, the wireless communication device manufacturing system including: a mounting apparatus including a mounting head mounted with a suction nozzle that sucks and holds the RFIC module; a conveyance apparatus configured to convey the antenna base material to a mounting position; and a heating apparatus configured to heat the hot melt adhesive layer of the RFIC module. The wireless communication device manufacturing system bonds the RFIC module in a state where the hot melt adhesive layer is softened by heating of the heating apparatus to the antenna base material disposed at the mounting position through the hot melt adhesive layer, and capacitively couples the antenna pattern and the terminal electrode through the hot melt adhesive layer.

According to this aspect, in a wireless communication device including an RFIC module including an RFIC chip, and an antenna pattern, it is possible to easily and reliably pick up the RFIC module and adhere the RFIC module to an antenna base material provided with the antenna pattern.

For example, the heating apparatus may heat the hot melt adhesive layer of the RFIC module in a state of being held by the suction nozzle of the mounting head. In this case, the mounting head conveys the RFIC module in a state where the hot melt adhesive layer is softened by heating of the heating apparatus to the mounting position, and adheres the RFIC module to the antenna base material disposed at the mounting position through the hot melt adhesive layer in a softened state.

For example, the heating apparatus may be a heater that is mounted on the mounting head and heats the suction nozzle in a state of holding the RFIC module.

For example, the heating apparatus may heat the suction nozzle in a state where the suction nozzle of the mounting head brings the hot melt adhesive layer of the RFIC module into contact with the antenna base material.

For example, the heating apparatus may be an optical heating apparatus that irradiates the RFIC module with light to heat the hot melt adhesive layer.

For example, the optical heating apparatus may irradiate the RFIC module in a state of being held by the suction nozzle of the mounting head with light at a heating position different from the mounting position. In this case, the mounting head conveys, to the mounting position, the RFIC module in a state of being heated by irradiation with light at the heating position and the hot melt adhesive layer being softened.

For example, the wireless communication device manufacturing system may further include a preheating apparatus configured to preheat the antenna base material disposed at the mounting position.

For example, the mounting head may include a plurality of suction nozzles that circle on the mounting head.

Hereinafter, aspects of the present disclosure will be described with reference to the drawings.

Figure 2:
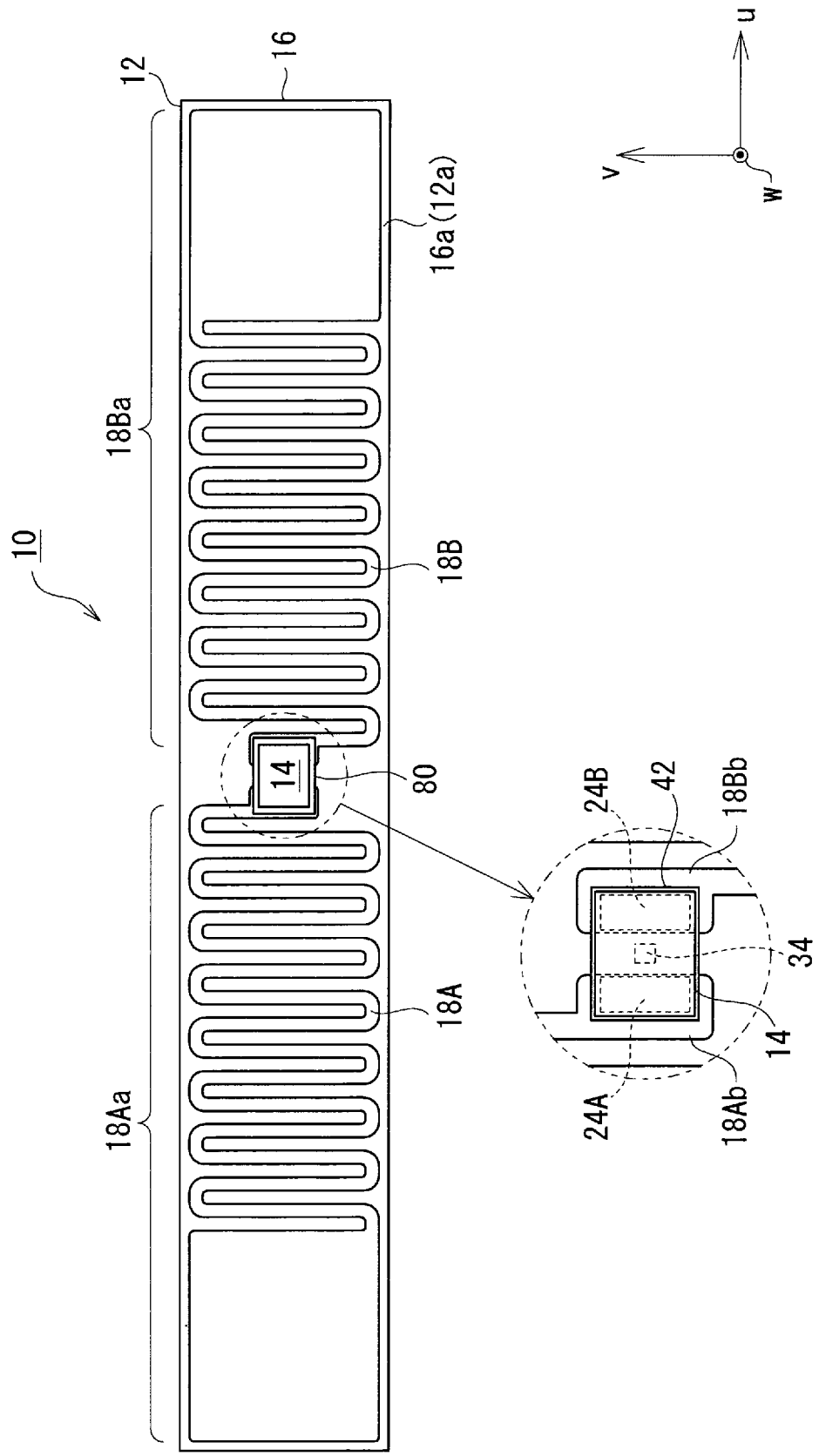
FIG. 2 is a top view of the wireless communication device.

FIG. 1 is a perspective view of an example of a wireless communication device manufactured by a wireless communication device manufacturing system in accordance with aspects of the present disclosure, and FIG. 2 is a top view of the wireless communication device. The u-v-w coordinate system in the drawings is for facilitating understanding of the disclosure and does not limit the disclosure. The u-axis direction indicates a longitudinal direction of the wireless communication device, the v-axis direction indicates a width direction, and the w-axis direction indicates a thickness direction.

As shown in FIGS. 1 and 2, the wireless communication device 10 is strip-shaped and is used as what is called a radio-frequency identification (RFID) tag.

Specifically, as shown in FIGS. 1 and 2, the wireless communication device 10 includes an antenna member 12 and a radio-frequency integrated circuit (RFIC) module 14 provided in the antenna member 12.

The antenna member 12 of the wireless communication device 10 has a strip shape (elongated rectangular shape) and includes an antenna base material 16 and antenna patterns 18A and 18B provided on one surface 16a of the antenna base material 16 (first main surface 12a of the antenna member 12).

The antenna base material 16 is a flexible sheet-shaped member made of an insulating material such as a polyimide resin. As shown in FIGS. 1 and 2, the antenna base material 16 also includes surfaces 16a and 16b that function as a first main surface 12a and a second main surface 12b of the antenna member 12. Since the antenna base material 16, which is a main component of the antenna member 12, has flexibility, the antenna member 12 can also have flexibility.

The antenna patterns 18A and 18B are used as antennas for the wireless communication device 10 to wirelessly communicate with an external communication apparatus (for example, when the wireless communication device 10 is used as an RFID tag, a reader/writer apparatus). In one aspect of the disclosure, the antenna patterns 18A and 18B are conductor patterns made of metal foil such as silver, copper, or aluminum, for example.

In addition, the antenna patterns 18A and 18B include radiating portions 18Aa and 18Ba for transmitting and receiving radio waves and coupling portions 18Ab and 18Bb (first and second coupling portions) for electrically connecting with the RFIC module 14.

In one aspect of the disclosure, the radiating portions 18Aa and 18Ba of the antenna patterns 18A and 18B are dipole antennas and have meander shapes. In addition, the radiating portions 18Aa and 18Ba respectively extend from the coupling portions 18Ab and 18Bb provided at the central part in the longitudinal direction (u-axis direction) of the antenna base material 16 toward both ends of the antenna base material 16.

Although details will be described below, the coupling portions 18Ab and 18Bb of the antenna patterns 18A and 18B are electrically connected to the terminal electrodes of the RFIC module 14. Each of the coupling portions 18Ab and 18Bb may be rectangular land.

Figure 3:
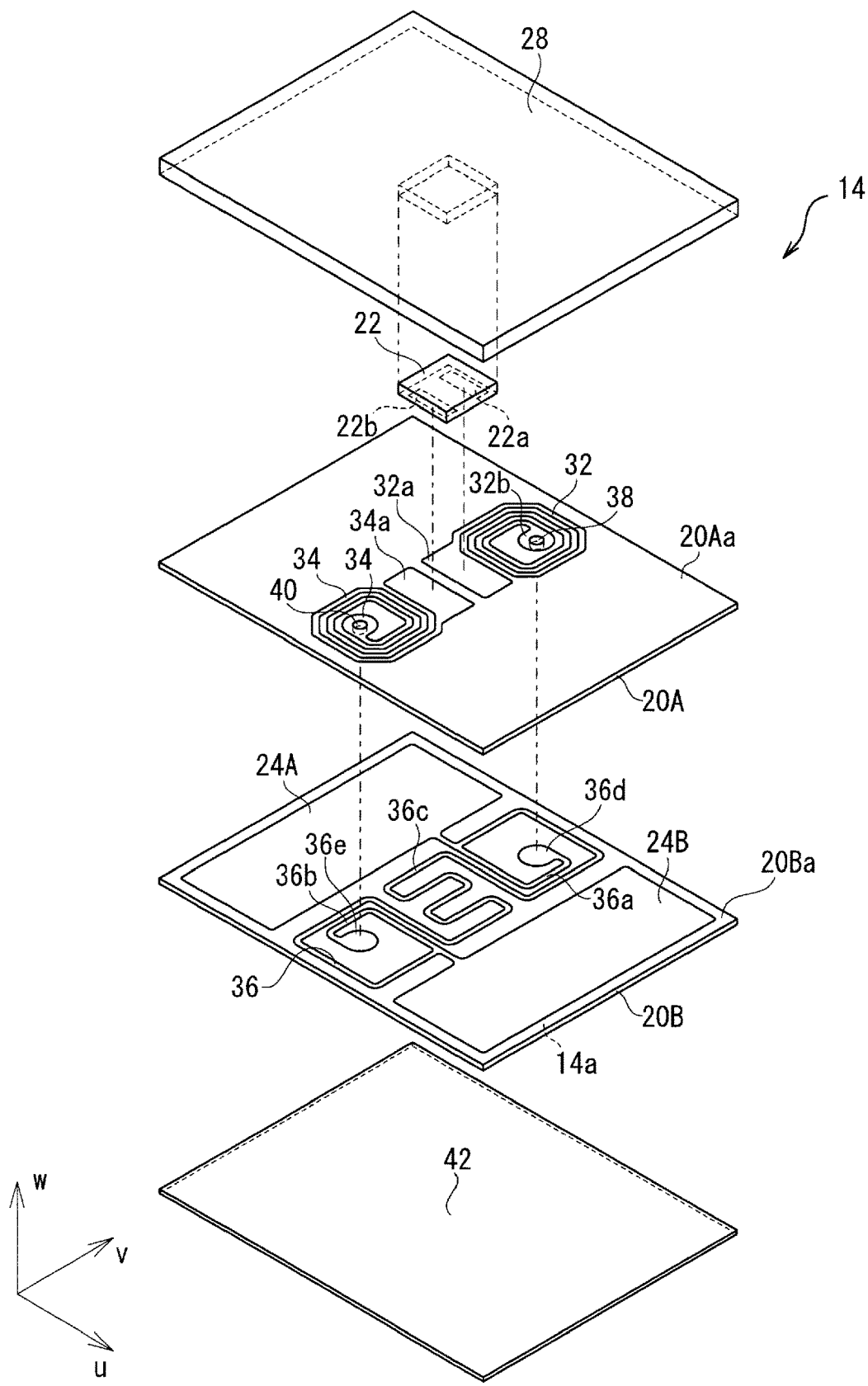
FIG. 3 is an exploded perspective view of an RFIC module.
Figure 4:
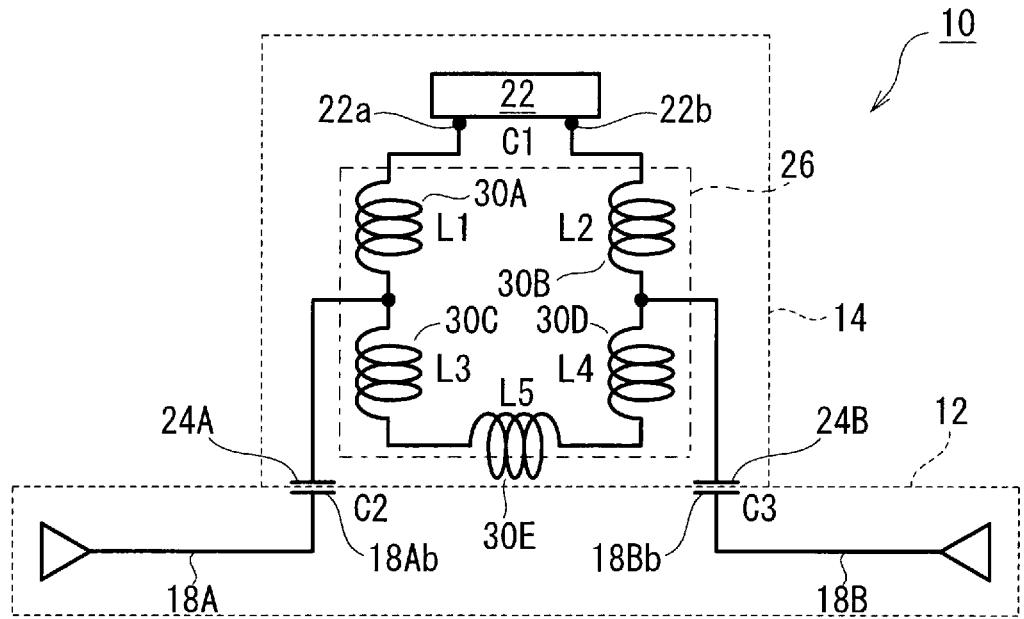
FIG. 4 is an equivalent circuit diagram of the wireless communication device.

FIG. 3 is an exploded perspective view of the RFIC module. FIG. 4 is an equivalent circuit diagram of a wireless communication device.

As shown in FIGS. 3 and 4, the RFIC module 14 is a device that performs wireless communication through the antenna patterns 18A and 18B at a communication frequency of, for example, a 900 MHz band, that is, a UHF band.

As shown in FIG. 3, in one aspect of the disclosure, the RFIC module 14 has a multilayered structure. Specifically, the RFIC module 14 includes two thin plate-shaped insulating sheets 20A and 20B made of an insulating material and laminated as a module base material which is a main component. Each of the insulating sheets 20A and 20B may be a flexible sheet made of an insulating material such as polyimide or liquid crystal polymer.

As shown in FIGS. 3 and 4, the RFIC module 14 includes an RFIC chip 22 and terminal electrodes 24A and 24B (first and second terminal electrodes) to be connected to the RFIC chip 22. In addition, the RFIC module 14 includes a matching circuit 26 provided between the RFIC chip 22 and the terminal electrodes 24A and 24B.

The RFIC chip 22 is a chip that drives at a frequency (communication frequency) in the UHF band, and has a structure in which various elements are built in a semiconductor substrate having a semiconductor such as silicon as a material. In addition, the RFIC chip 22 includes a first input/output terminal 22a and a second input/output terminal 22b. Furthermore, as shown in FIG. 4, the RFIC chip 22 includes an internal capacitor (capacitance: self-capacitor of the RFIC chip itself) C1. Here, the areas of the terminal electrodes 24A and 24B are larger than the areas of the first input/output terminal 22a and the second input/output terminal 22b. Accordingly, productivity of the wireless communication device 10 is improved. This is because aligning the RFIC module 14 with the antenna patterns 18A and 18B is easier than aligning the first and second input/output terminals 22a and 22b of the RFIC chip 22 directly on the coupling portions 18Ab and 18Bb of the antenna patterns 18A and 18B.

In addition, as shown in FIG. 3, the RFIC chip 22 is built in the RFIC module 14 which is a multilayered structure. Specifically, the RFIC chip 22 is disposed on the insulating sheet 20A and sealed in the resin package 28 formed on the insulating sheet 20A. The resin package 28 is made of, for example, an elastomer resin such as polyurethane or a hot melt resin. The RFIC chip 22 is protected by the resin package 28. In addition, the resin package 28 improves the flexural rigidity of the RFIC module 14 having a multilayered structure including the flexible insulating sheets 20A and 20B (as compared with the rigidity of the insulating sheet alone). As a result, the RFIC module 14 incorporating the RFIC chip 22 can be handled by a component supply apparatus such as a part feeder as described below, similarly to electronic components (for reference, the RFIC chip 22 alone may be subject to damage such as chipping, and thus cannot be handled by a part feeder or the like described below).

The terminal electrodes 24A and 24B are conductor patterns made of a conductor material such as silver, copper, or aluminum, and are provided on an inner surface 20Ba (a surface opposite to the first main surface 14a and facing the insulating sheet 20A) of the insulating sheet 20B constituting the first main surface 14a of the RFIC module 14. That is, in one aspect of the disclosure, the terminal electrodes 24A and 24B are incorporated without being exposed to the outside of the RFIC module 14. In addition, the terminal electrodes 24A and 24B have a rectangular shape. It may be noted that although described below, these terminal electrodes 24A and 24B are electrodes for electrically connecting to the coupling portions 18Ab and 18Bb of the antenna patterns 18A and 18B through the hot melt adhesive layer 42.

As shown in FIG. 4, the matching circuit 26 to be provided between the RFIC chip 22 and the terminal electrodes 24A and 24B includes a plurality of inductance elements 30A to 30E.

Each of the plurality of inductance elements 30A to 30E includes a conductor pattern provided on each of the insulating sheets 20A and 20B.

Conductor patterns 32 and 34 made of a conductor material such as silver, copper, or aluminum are provided on an outer surface 20Aa (a surface on which the resin package 28 is provided) of the insulating sheet 20A of the RFIC module 14. The respective conductor patterns 32 and 34 are spiral coil-shaped patterns, and include land portions 32a and 34a for electrical connecting with the RFIC chip 22 at the outer peripheral side ends. It may be noted that the land portion 32a, and the first input/output terminal 22a of the RFIC chip 22, are electrically connected to each other through, for example, solder or a conductive adhesive. Similarly, the land portion 34a and the second input/output terminal 22b are also electrically connected to each other.

As shown in FIG. 4, one spiral coil-shaped conductor pattern 32 on the insulating sheet 20A constitutes an inductance element 30A having an inductance L1. In addition, the other spiral coil-shaped conductor pattern 34 constitutes an inductance element 30B having an inductance L2.

The insulating sheet 20B adjacent to the insulating sheet 20A is provided with a conductor pattern 36 made of a conductor material such as silver, copper, or aluminum. The conductor pattern 36 includes terminal electrodes 24A and 24B, spiral coil portions 36a and 36b, and a meander portion 36c. In the insulating sheet 20B, the spiral coil portions 36a and 36b and the meander portion 36c are disposed between the terminal electrodes 24A and 24B.

One spiral coil portion 36a in the conductor pattern 36 on the insulating sheet 20B is electrically connected to the terminal electrode 24A. In addition, the center side end 36d of the spiral coil portion 36a is electrically connected to the center side end 32b of the spiral coil-shaped conductor pattern 32 on the insulating sheet 20A through an interlayer connecting conductor 38 such as a through-hole conductor formed on the insulating sheet 20A. In addition, the spiral coil portion 36a is configured so that the circling directions of a current flowing through the conductor pattern 32 and a current flowing through the spiral coil portion 36a are the same. Furthermore, as shown in FIG. 4, the spiral coil portion 36a constitutes an inductance element 30C having an inductance L3.

The other spiral coil portion 36b in the conductor pattern 36 on the insulating sheet 20B is electrically connected to the terminal electrode 24B. In addition, the center side end 36e of the spiral coil portion 36b is electrically connected to the center side end 34b of the spiral coil-shaped conductor pattern 34 on the insulating sheet 20A through an interlayer connecting conductor 40 such as a through-hole conductor formed on the insulating sheet 20A. In addition, the spiral coil portion 36b is configured so that the circling directions of a current flowing through the conductor pattern 34 and a current flowing through the spiral coil portion 36b are the same. Furthermore, as shown in FIG. 4, the spiral coil portion 36b constitutes an inductance element 30D having an inductance L4.

The meander portion 36c in the conductor pattern 36 on the insulating sheet 20B electrically connects the outer peripheral side end of the one spiral coil portion 36a and the outer peripheral side end of the other spiral coil portion 36b. In addition, as shown in FIG. 4, the meander portion 36c constitutes an inductance element 30E having an inductance L5.

By the matching circuit 26 including the inductance elements 30A to 30E (also including the self-capacitor C1 of the RFIC chip 22), the impedance between the RFIC chip 22 and the terminal electrodes 24A and 24B is matched at a predetermined frequency (communication frequency). In addition, the inductance elements 30A to 30E and the RFIC chip 22 make a closed loop circuit, and since the terminal electrodes 24A and 24B are connected to the inductance element 30E in between, the impedance becomes low in a low frequency band (frequency band of DC to 400 MHz).

According to this wireless communication device 10, when the antenna patterns 18A and 18B receive a radio wave (signal) at a predetermined frequency (communication frequency) in the UHF band, a current corresponding to the signal flows from the antenna patterns 18A and 18B to the RFIC chip 22. The RFIC chip 22 is driven by the supply of the current, and outputs a current (signal) corresponding to information stored in a storage unit (not shown) inside the RFIC chip to the antenna patterns 18A and 18B. Then, a radio wave (signal) corresponding to the current is radiated from the antenna patterns 18A and 18B.

Hitherto, the configuration of the wireless communication device 10 has been described. Hereinafter, a wireless communication device manufacturing system for manufacturing the wireless communication device 10 will be described.

First, the wireless communication device manufacturing system according to one aspect of the disclosure is a system that adheres the RFIC module 14 to the antenna base material 16 through the hot melt adhesive layer 42.

Figure 5:
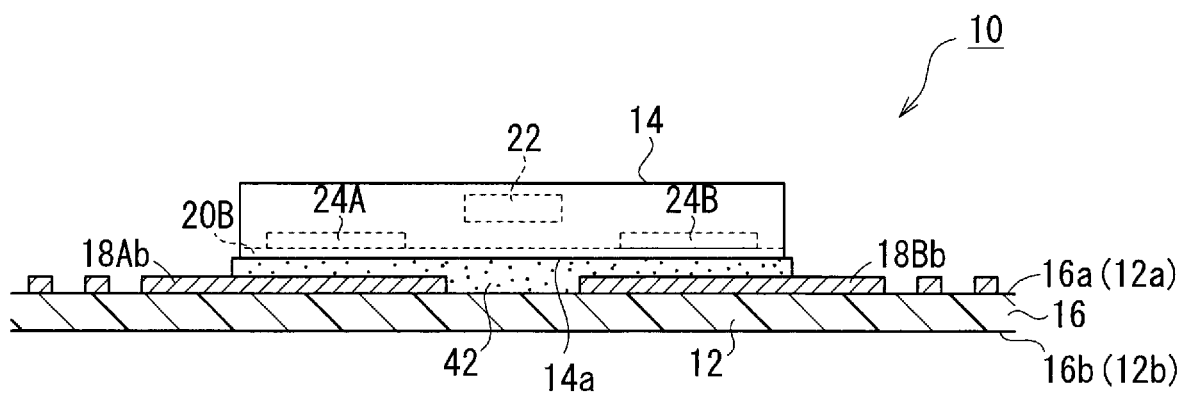
FIG. 5 is a partial cross-sectional view of the wireless communication device.
Figure 5:
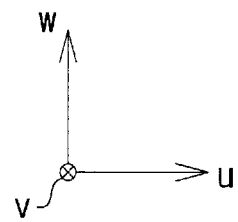

FIG. 5 is a partial cross-sectional view of a wireless communication device.

As shown in FIG. 5, in one aspect of the disclosure, the first main surface 12a of the antenna member 12 provided with the antenna patterns 18A and 18B and the first main surface 14a of the RFIC module 14 are adhered to each other through the hot melt adhesive layer 42. As a result, the coupling portions 18Ab and 18Bb of the antenna patterns 18A and 18B and the terminal electrodes 24A and 24B of the RFIC module 14 are electrically connected, that is, capacitively coupled through the hot melt adhesive layer 42.

The hot melt adhesive constituting the hot melt adhesive layer 42 softens (partially melts) when heated from the solid state, and solidifies again when cooled in a softened state. In one aspect of the disclosure, the hot melt adhesive is, for example, an EVA-based thermoplastic resin that maintains a solid state and is not deformed at a temperature of a use environment of the wireless communication device 10. In addition, in one aspect of the disclosure, the hot melt adhesive layer 42 in the solid state has insulating properties. Furthermore, in one aspect of the disclosure, the hot melt adhesive layer 42 has a lower melting temperature, for example, a melting temperature of 50 to 100 degrees, than the other components of the RFIC module 14.

In one aspect of the disclosure, before the RFIC module 14 is adhered to the antenna member 12, the hot melt adhesive layer 42 is provided in advance on the first main surface 14a of the RFIC module 14 as shown in FIG. 3. For example, the hot melt adhesive is applied to the RFIC module 14 in a layered form in advance by a hot melt application apparatus, whereby the hot melt adhesive layer 42 is made to be a component of the RFIC module 14.

Therefore, the wireless communication device manufacturing system according to one aspect of the disclosure is configured to bond the antenna base material 16 and the RFIC module 14 by softening the solid hot melt adhesive layer 42 on the RFIC module 14 and solidifying the softened hot melt adhesive layer 42 between the antenna base material 16 and the RFIC module 14 again. It may be noted that the term "softening" as used herein refers to a state in which the entire hot melt adhesive layer 42 is soft enough not to be separated from the RFIC module 14 without the entire hot melt adhesive layer 42 melted (liquefied).

Figure 6:
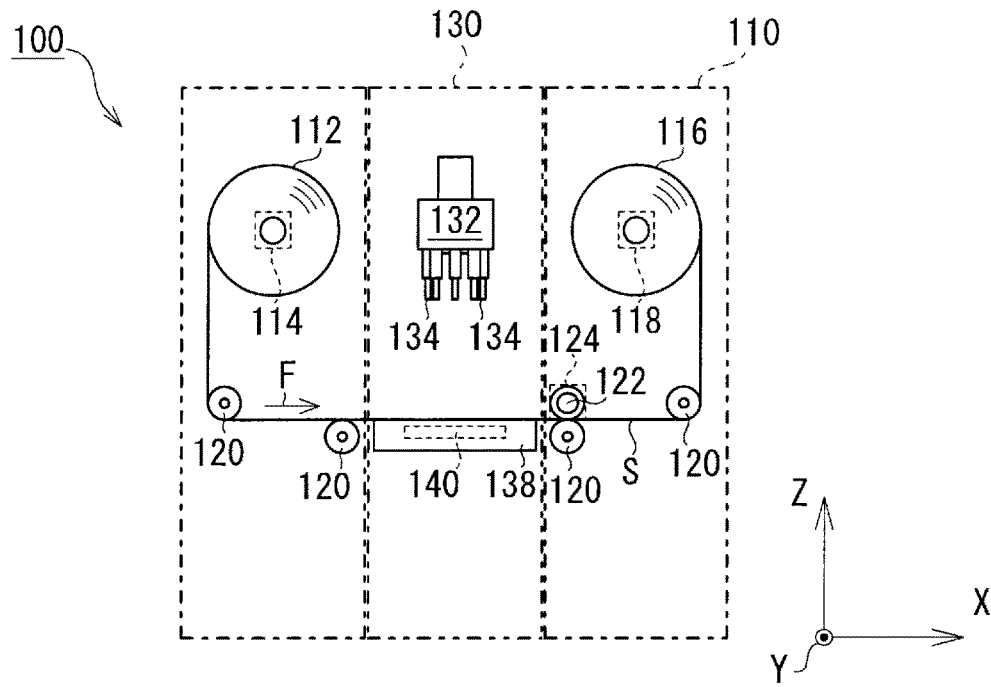
FIG. 6 is a front view schematically showing a configuration of the wireless communication device manufacturing system in accordance with aspects of the present disclosure.

FIG. 6 is a front view schematically showing a configuration of the wireless communication device manufacturing system according to one aspect of the disclosure. It may be noted that the X-Y-Z coordinate system shown in the drawings is for facilitating understanding of the disclosure, and does not limit the disclosure. The X-axis direction and the Y-axis direction indicate the horizontal direction, and the Z-axis direction indicates the vertical direction.

In one aspect of the disclosure, the plurality of antenna members 12 before the RFIC module 14 is bonded are integrated into one. Specifically, a plurality of antenna patterns 18A and 18B are formed side by side on a material sheet S that is a material of the antenna base material 16 constituting the antenna member 12. The RFIC module 14 is bonded to each of the plurality of antenna patterns 18A and 18B on the material sheet S. The material sheet S in a state in which the plurality of RFIC modules 14 are bonded is divided into a plurality of wireless communication devices 10 as shown in FIG. 1 in a subsequent step.

As shown in FIG. 6, the wireless communication device manufacturing system 100 according to one aspect of the disclosure includes a conveyance apparatus 110 that conveys the material sheet S (antenna base material 16) to the mounting position MP, and a mounting apparatus 130 that bonds the RFIC module 14 to a portion of the material sheet S on the mounting position MP.

In one aspect of the disclosure, the conveyance apparatus 102 conveys the material sheet S on which a plurality of antenna patterns 18A and 18B are formed in advance by a roll-to-roll method. Specifically, the material sheet S is a long sheet that is long in the conveyance direction F.

The conveyance apparatus 110 includes a supply reel 112 that holds the material sheet S in a wound state and supplies the material sheet S to the mounting position MP, a motor 114 that rotates the supply reel 112, a collection reel 116 that winds and collects the material sheet S to which the RFIC module 14 is bonded at the mounting position MP, and a motor 118 that rotates the collection reel 116. In addition, the conveyance apparatus 102 includes a plurality of guide rollers 120 that guide the material sheet S so as to pass through the mounting position MP, a feed roller 122 that feeds the material sheet S in the conveyance direction F, and a motor 124 that rotates the feed roller 122.

It may be noted that the conveyance apparatus 110 that conveys the material sheet S is not limited to a roll-to-roll-method conveyance apparatus. For example, when the material sheet S is a flat sheet, the conveyance apparatus may be an apparatus that conveys the material sheet S using a belt conveyor.

Figure 7:
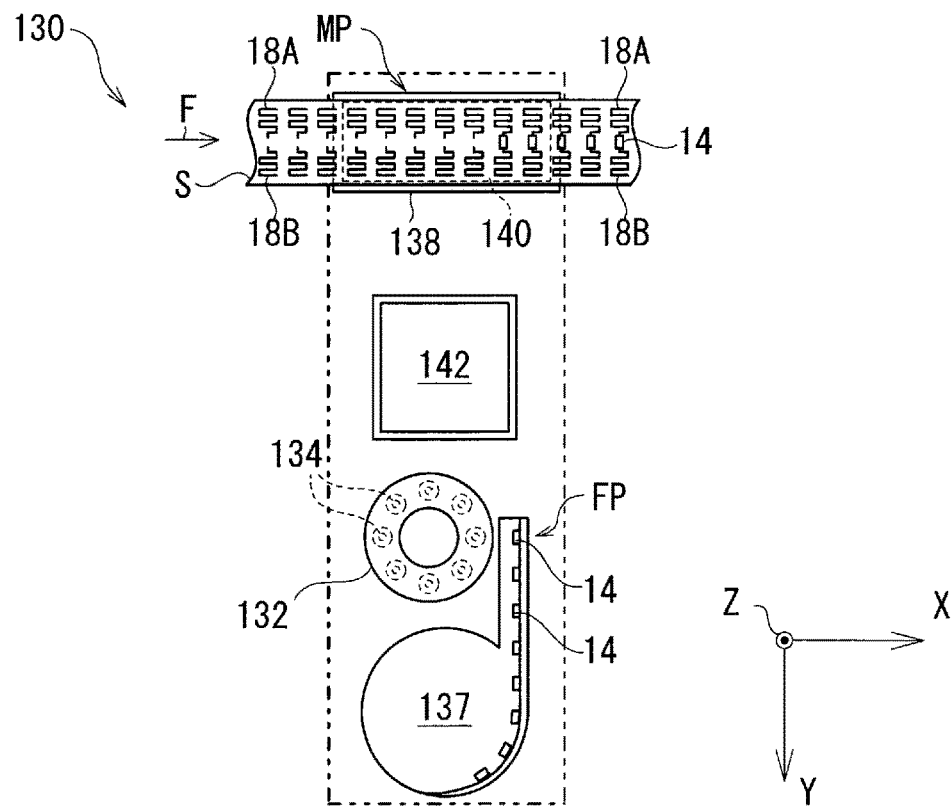
FIG. 7 is a top view schematically showing a configuration of a mounting apparatus.

FIG. 7 is a top view schematically showing a configuration of the mounting apparatus. In addition, FIG. 8 is a schematic partial cross-sectional view of a mounting head of the mounting apparatus.

Figure 8:
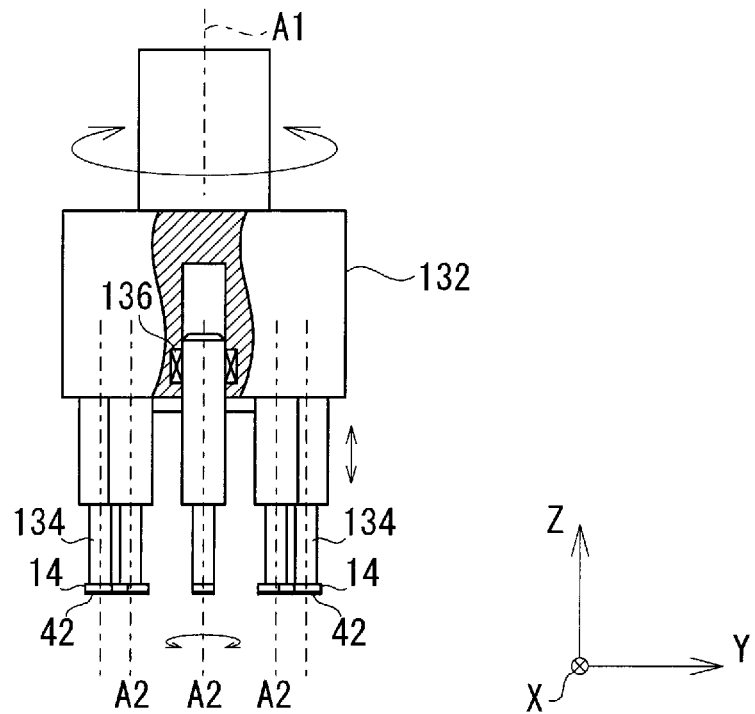
FIG. 8 is a schematic partial cross-sectional view of a mounting head of the mounting apparatus.

As shown in FIGS. 7 and 8, the mounting apparatus 130 includes a mounting head 132 that is movable in the horizontal direction (X-axis direction and Y-axis direction) and the vertical direction (Z-axis direction) and picks the RFIC module 14. The mounting head 132 is mounted with a plurality of suction nozzles 134 for sucking and holding the RFIC module 14. In one aspect of the disclosure, the mounting head 132 is what is called a rotary head, and the plurality of suction nozzles 134 circle around the head center line A1 extending in the vertical direction on the mounting head 132. It may be noted that the mounting head 132 may be what is called a single head on which only one suction nozzle 134 may be mounted.

Each of the plurality of suction nozzles 134 of the mounting head 132 is mounted on the mounting head 132 so as to be rotatable about a nozzle center line A2 extending in the vertical direction (Z-axis direction) and movable in the vertical direction. In addition, although the reason will be described below, for example, the mounting head 132 is mounted with a heater 136 as a heating apparatus that heats a suction nozzle 134.

The mounting apparatus 130 also includes a part feeder 137 as a supply apparatus that supplies an RFIC module 14 to the mounting head 132. The part feeder 137 conveys the RFIC module 14 toward the supply position FP with the hot melt adhesive layer 42 facing downward. The suction nozzle 134 of the mounting head 132 sucks and picks up from above the RFIC module supplied to the supply position FP, and holds the RFIC module 14 in a state where the hot melt adhesive layer 42 faces downward.

The mounting apparatus 130 further includes a suction table 138 that sucks and supports a portion of the material sheet S to which the RFIC module 14 is bonded by the mounting head 132 at the mounting position MP. As shown in FIG. 6, the suction table 138 fixes a portion of the material sheet S to which the RFIC module 14 is to be bonded by sucking the material sheet S while supporting the material sheet S from below. In one aspect of the disclosure, the suction table 138 includes a preheating heater 140 as a preheating apparatus that preheats the material sheet S on the suction table 138 although the reason will be described below.

The mounting apparatus 130 further includes a camera 142 that photographs an RFIC module 14 held by the suction nozzle 134 of the mounting head 132. Based on the captured image of the camera 142, the suction nozzle 134 rotates, and the attitude of the RFIC module 14 is finely adjusted.

In the mounting apparatus 130 of the present disclosure, the hot melt adhesive layer 42 of the RFIC module 14 is heated and softened in a state where the RFIC module 14 is held by the suction nozzle 134 of the mounting head 132.

Figure 9:
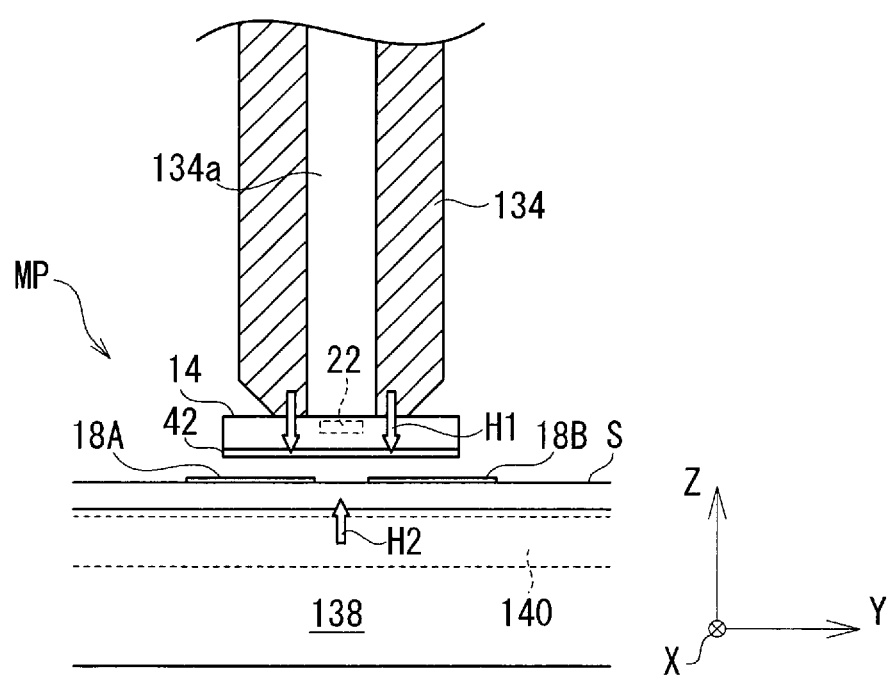
FIG. 9 is a diagram showing the RFIC module in a state of being heated while held by a suction nozzle of the mounting head.

FIG. 9 is a diagram showing the RFIC module in a state of being heated while held by the suction nozzle of the mounting head.

As shown in FIG. 9, when sucked and held by the suction nozzle 134 at the supply position FP, the hot melt adhesive layer 42 of the RFIC module 14 starts to be heated. Specifically, as shown in FIG. 8, the suction nozzle 134 is heated by a heater 136 provided in the mounting head 132. As shown in FIG. 9, the heat H1 is transferred from the heated suction nozzle 134 to the RFIC module 14, whereby the hot melt adhesive layer 42 is heated. It may be noted that as shown in FIG. 9, it is preferable that the suction nozzle 134 sucks and holds the RFIC module 14 in a state where the RFIC chip 22 and the suction port 134a overlap each other. Accordingly, the amount of heat H1 transferred from the suction nozzle 134 to the RFIC chip 22 is suppressed as compared with the case where the RFIC chip 22 and the suction port 134a do not overlap. As a result, for example, as shown in FIG. 3, the occurrence of a defect is suppressed in which solder or the like electrically connecting the RFIC chip 22 and the land portions 32a and 34a is melted.

As shown in FIG. 9, the hot melt adhesive layer 42 of the RFIC module 14 is conveyed from the supply position FP to the mounting position MP while being heated by the heat H1 transferred from the suction nozzle 134. During the conveyance from the supply position FP to the mounting position MP, the hot melt adhesive layer 42 is sufficiently softened. Then, at the mounting position MP, the RFIC module 14 in a state where the hot melt adhesive layer 42 is sufficiently softened is brought into contact with the material sheet S through the hot melt adhesive layer 42 by the mounting head 132. When the suction nozzle 134 stops the suction and releases the RFIC module 14 in a state of being in contact with the material sheet S, the transfer of the heat H1 from the suction nozzle 134 to the RFIC module 14 stops and the hot melt adhesive layer 42 starts to be cured. As a result, the RFIC module 14 is bonded to the material sheet S through the hot melt adhesive layer 42. In addition, as shown in FIG. 5, the terminal electrodes 24A and 24B of the RFIC module 14 and the coupling portions 18Ab and 18Bb of the antenna patterns 18A and 18B on the material sheet S (antenna base material 16) are capacitively coupled through the hot melt adhesive layer 42.

It may be noted that the heater 136 may heat the hot melt adhesive layer 42 through the suction nozzle 134 in a state where the suction nozzle 134 of the mounting head 132 brings the hot melt adhesive layer 42 of the RFIC module 14 into contact with the material sheet S. Accordingly, air between the hot melt adhesive layer 42 and the material sheet S is sufficiently released, and adhesion between them is improved.

In one aspect of the disclosure, the material sheet S is preheated by the preheating heater 140 of the suction table 138. As a result, the hot melt adhesive layer 42 is prevented from being solidified immediately after coming into contact with the cooled material sheet S, and the hot melt adhesive layer 42 and the material sheet S are prevented from insufficient adhesion. In addition, since the hot melt adhesive layer 42 can be heated by both the heat H2 from the preheating heater 140 and the heat H1 through the suction nozzle 134 from the heater 136, the heat output of the heater 136 can be kept low (as compared with a case without the preheating heater 140). With this, the heater 136 can be reduced in size, and the mounting head 132 can be reduced in weight. As a result, the mounting head 132 can move at a high speed.

Furthermore, in one aspect of the disclosure, the hot melt adhesive layer 42 is heated in a state in non-contact with the heater 136 which is a heating apparatus. As a result, the hot melt adhesive layer 42 is prevented from being separated from the RFIC module 14 and being transferred onto the heating apparatus.

As described above, according one aspect of the disclosure, in the wireless communication device 10 including the RFIC module 14 including the RFIC chip 22 and the antenna patterns 18A and 18B, the RFIC module 14 can be easily and reliably picked up and bonded to the antenna base material 16 provided with the antenna patterns 18A and 18B.

Specifically, before the RFIC module 14 is picked up, the hot melt adhesive layer 42 on the RFIC module 14 is in a solid state and has substantially no adhesiveness. Accordingly, the suction nozzle 134 of the mounting head 132 can easily and reliably pick up the RFIC module 14. In addition, since the hot melt adhesive layer 42 can be adhesive by being heated while being held by the suction nozzle 134, the RFIC module 14 can be adhered to the antenna base material 16.

Before the RFIC module 14 is picked up, the hot melt adhesive layer 42 on the RFIC module 14 is in a solid state and has substantially no adhesiveness. However, in rare cases, the RFIC modules 14 may weakly stick to each other due to the frictional force of the hot melt adhesive layer 42.

Examples of one of methods for reducing the occurrence of such sticking between the RFIC modules 14 include performing various pieces of surface treatment on the surface of the hot melt adhesive layer 42.

FIGS. 10A to 10D show examples of a surface shape of the hot melt adhesive layer subjected to surface treatment.

Figure 10A:
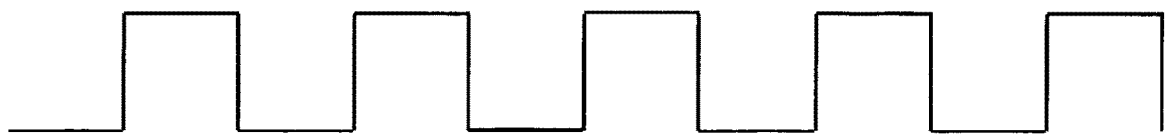
FIG. 10A shows an example of a surface shape of a hot melt adhesive layer subjected to surface treatment.
Figure 10B:
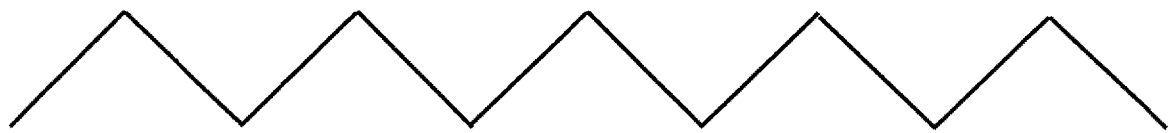
FIG. 10B shows another example of a surface shape of a hot melt adhesive layer subjected to surface treatment.
Figure 10C:
FIG. 10C shows still another example of a surface shape of a hot melt adhesive layer subjected to surface treatment.
Figure 10D:
FIG. 10D shows a different example of a surface shape of a hot melt adhesive layer subjected to surface treatment.

For example, the surface of the hot melt adhesive layer 42 is treated into an uneven surface as shown in FIGS. 10A to 10C, or roughened as shown in FIG. 10D. Such an uneven surface and a rough surface can be formed, for example, by heating to melt and then cooling to cure again the hot melt adhesive layer 42 while a member such as a separator or a metal mesh is pressed against the surface of the hot melt adhesive layer 42.

In addition, as another method for reducing the occurrence of sticking between the RFIC modules 14, for example, there is a method of applying a release agent to the surface of the hot melt adhesive layer 42.

Furthermore, as still another method for reducing the occurrence of sticking between the RFIC modules 14, for example, there is a method of mixing bead particles in the hot melt adhesive layer 42.

The wireless communication device manufacturing system according one aspect of the disclosure is substantially the same as the wireless communication device manufacturing system 100 according to the above-described aspect excluding the point that a heating apparatus for heating the hot melt adhesive layer is different. Therefore, the present aspect will be described focusing on this different point.

Figure 11:
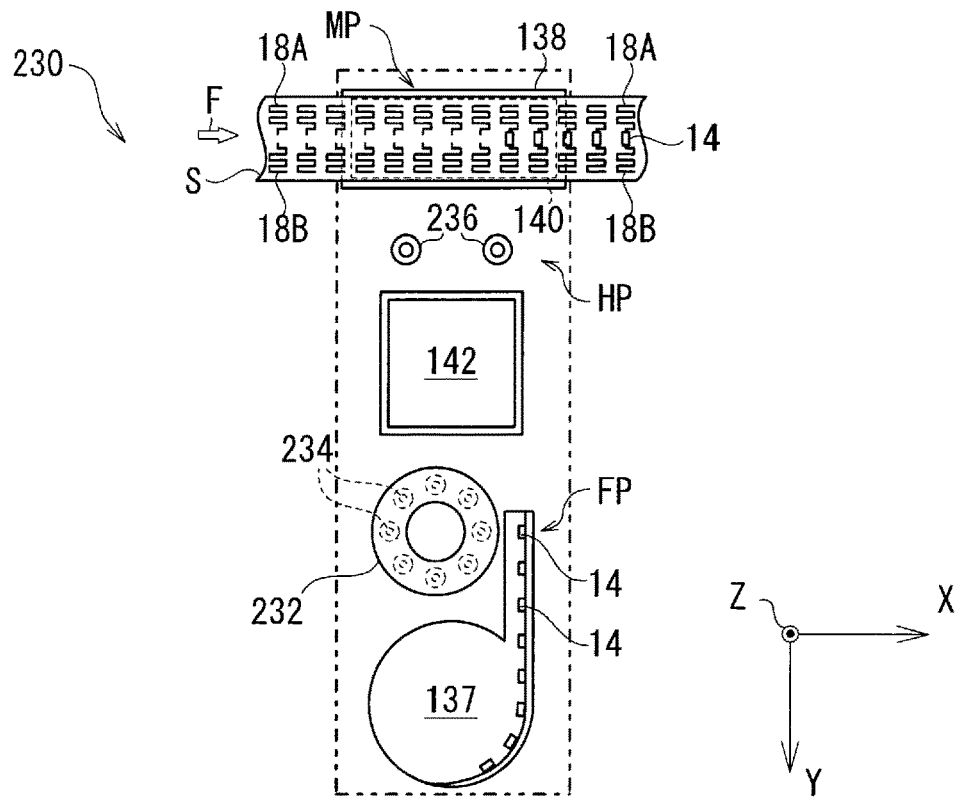
FIG. 11 is a top view schematically showing a configuration of a mounting apparatus in the wireless communication device manufacturing system in accordance with aspects of the present disclosure.

FIG. 11 is a diagram schematically showing a configuration of a mounting apparatus in the wireless communication device manufacturing system according to one aspect of the disclosure.

As shown in FIG. 11, in the mounting apparatus 230 in the wireless communication device manufacturing system according to one aspect of the disclosure, the heating apparatus 236 for heating the hot melt adhesive layer 42 of the RFIC module 14 is not provided in the mounting head 232. The heating apparatus 236 heats the hot melt adhesive layer 42 at a heating position HP different from the mounting position MP in the mounting apparatus 230.

Figure 12:
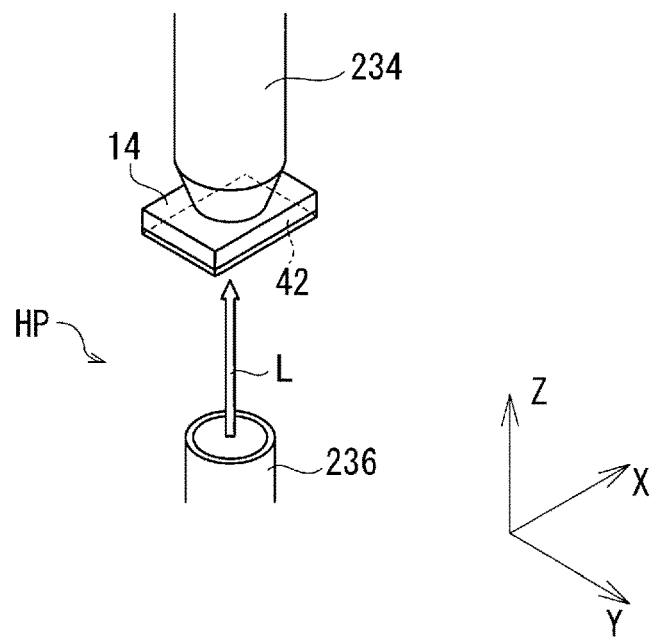
FIG. 12 is a perspective view showing the RFIC module in a state of being heated by light irradiation while being held by the suction nozzle of the mounting head.

FIG. 12 is a perspective view showing the RFIC module in a state of being heated by light irradiation while being held by the suction nozzle of the mounting head.

In one aspect of the disclosure, as shown in FIG. 12, the heating apparatus 236 is an optical heating apparatus that is disposed at the heating position HP and irradiates the RFIC module 14 in a state of being held by the suction nozzle 234 with light to heat the hot melt adhesive layer 42. In one aspect of the disclosure, the heating apparatus 236 irradiates the hot melt adhesive layer 42 with the laser light L, thereby heating and softening the hot melt adhesive layer 42. The laser light L is, for example, ultraviolet light.

In one aspect of the disclosure, the heating apparatus 236 is fixed at the heating position HP. Therefore, the RFIC module 14 in a state of being held by the suction nozzle 134 is disposed above the heating apparatus 236 by the mounting head 232. When heating of one RFIC module 14 is completed, a plurality of suction nozzles 234 circle, and heating of the next RFIC module 14 is started. When the heating of the hot melt adhesive layer 42 of the RFIC modules 14 held by the mounting head 232 is completed, the mounting head 232 conveys the RFIC module 14 in a state where the hot melt adhesive layer 42 is softened to the mounting position MP. It may be noted that the heating apparatus 236, that is, the heating position HP is preferably positioned near the mounting position MP so that the heated hot melt adhesive layer 42 does not cool during conveyance. In addition, in order to enhance heating efficiency by light, an optical absorbent may be contained in the hot melt adhesive layer 42.

It may be noted that in the case of the present aspect, since the mounting head 232 is not mounted with the heating apparatus 236, the mounting head 232 is reduced in weight and can move at a high speed.

Also in the present aspect as described above, similarly to one aspect of the disclosure described above, in the wireless communication device 10 including the RFIC module 14 including the RFIC chip 22 and the antenna patterns 18A and 18B, the RFIC module 14 can be easily and reliably picked up and bonded to the antenna base material 16 provided with the antenna patterns 18A and 18B.

The wireless communication device manufacturing system according to one aspect of the disclosure is substantially the same as the wireless communication device manufacturing system 100 according to the above-described aspect excluding the point that a heating apparatus for heating the hot melt adhesive layer is different. Therefore, the present aspect will be described focusing on this different point.

Figure 13:
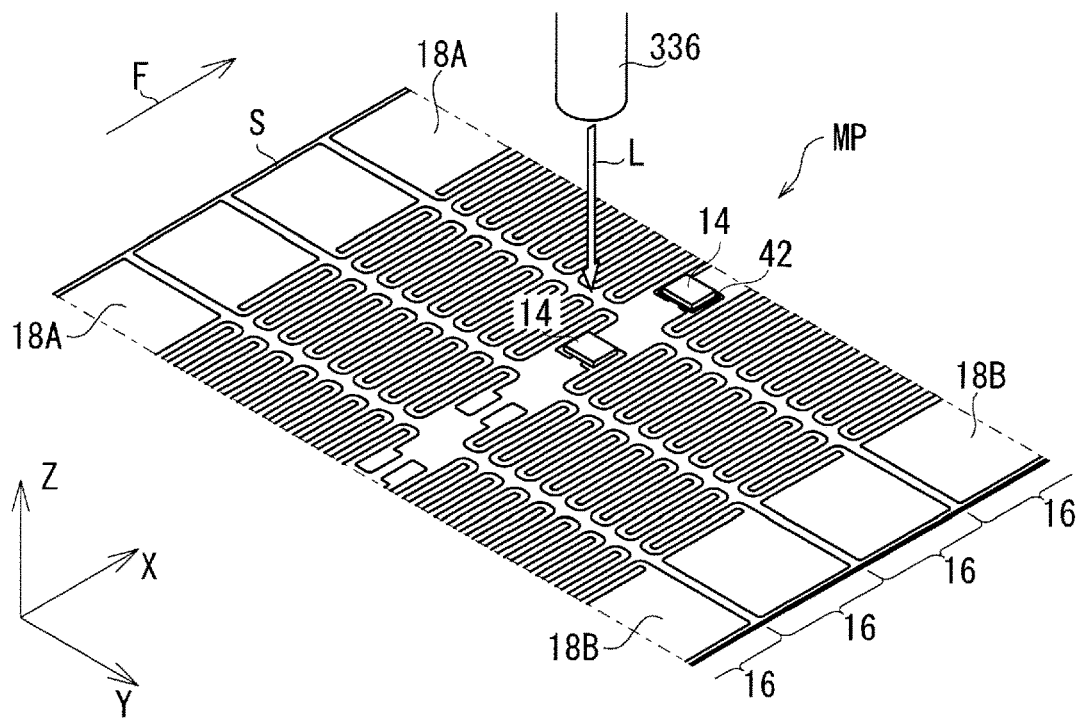
FIG. 13 is a diagram schematically showing a heating apparatus of a mounting apparatus in the wireless communication device manufacturing system in accordance with aspects of the present disclosure.

FIG. 13 is a diagram schematically showing a heating apparatus of a mounting apparatus in the wireless communication device manufacturing system in accordance with aspects of the present disclosure.

As shown in FIG. 13, the heating apparatus 336 in the wireless communication device manufacturing system according to the present aspect heats and softens, from above, the hot melt adhesive layer 42 of the RFIC module 14 in a state of being placed by the mounting head on the antenna patterns 18A and 18B of the material sheet S (that is, the antenna base material 16) disposed at the mounting position MP. The heating apparatus 336 heats the hot melt adhesive layer 42 after the mounting head having placed the RFIC module 14 on the material sheet S retracts from the mounting position MP. The heating apparatus 336 is, for example, an optical heating apparatus that applies the laser light L from above toward the RFIC module 14 to soften the hot melt adhesive layer 42 of the RFIC module 14. Instead, the heating apparatus 336 may be a heater that moves above the RFIC module 14 and heats the hot melt adhesive layer 42 of the RFIC module 14. It may be noted that in the case of the present aspect, after a plurality of RFIC modules 14 are placed on the material sheet S, the hot melt adhesive layer 42 of each of the plurality of RFIC modules 14 may be simultaneously heated. In addition, the material sheet S in a state where an RFIC module 14 is placed thereon by the mounting head may be conveyed from the mounting position MP, and the heating apparatus 336 may heat the hot melt adhesive layer 42 of the RFIC module 14 at the conveyance destination.

Also in the present aspect as described above, similarly to the aspect described above, in the wireless communication device 10 including the RFIC module 14 including the RFIC chip 22 and the antenna patterns 18A and 18B, the RFIC module 14 can be easily and reliably picked up and bonded to the antenna base material 16 provided with the antenna patterns 18A and 18B.

The wireless communication device manufacturing system according to one aspect of the disclosure is substantially the same as the wireless communication device manufacturing system 100 according to the above-described aspect excluding the point that a heating apparatus for heating the hot melt adhesive layer is different. Therefore, the present aspect will be described focusing on this different point.

Figure 14:
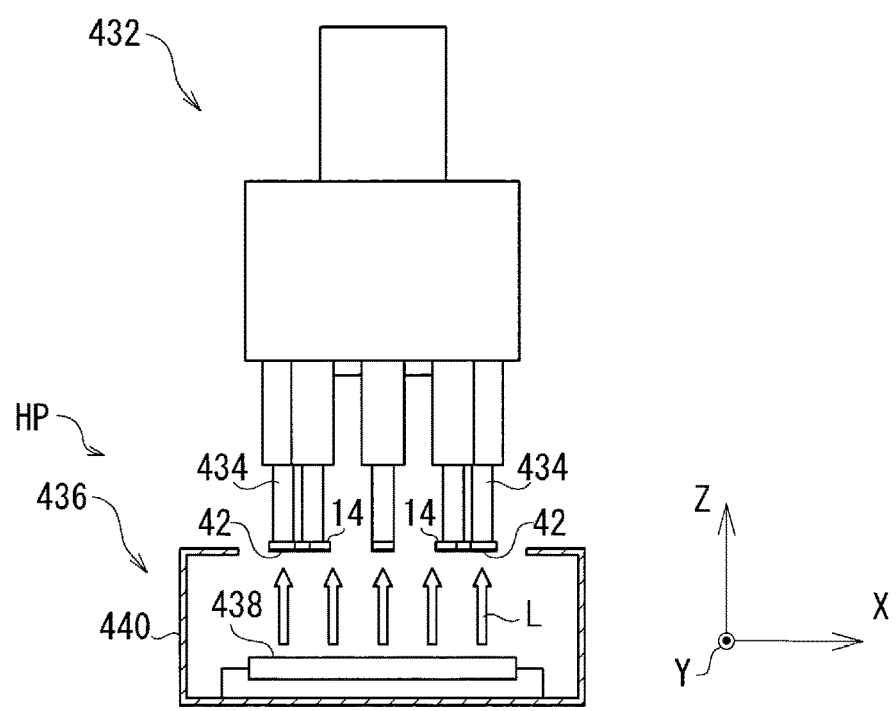
FIG. 14 is a diagram schematically showing a heating apparatus of a mounting apparatus in the wireless communication device manufacturing system in accordance with aspects of the present disclosure.

FIG. 14 is a diagram schematically showing a heating apparatus of a mounting apparatus in the wireless communication device manufacturing system in accordance with aspects of the present disclosure.

As shown in FIG. 14, in the mounting apparatus in the wireless communication device manufacturing system according to one aspect of the disclosure, the heating apparatus 436 is not mounted on the mounting head 432 and is disposed at a heating position HP different from the mounting position MP. In addition, the heating apparatus 436 simultaneously heats the hot melt adhesive layers 42 of the plurality of RFIC modules 14 held by the plurality of respective suction nozzles 434 of the mounting head 432. Specifically, the heating apparatus 436 includes a light source 438 that radiates light L in a wide range, such as a halogen lamp, and a casing 440 that houses the light source 438 and reflects the light L. The RFIC modules 14 in a state of being held by the plurality of suction nozzles 434 are disposed in the casing 440 by the mounting head 432. Then, the hot melt adhesive layers 42 of the disposed respective RFIC modules 14 are simultaneously heated and softened by the light source 438.

It may be noted that in the case of the present aspect, since the mounting head 432 is not mounted with the heating apparatus 436, the mounting head 432 is reduced in weight and can move at a high speed.

Also in the present aspect as described above, similarly to the aspect described above, in the wireless communication device 10 including the RFIC module 14 including the RFIC chip 22 and the antenna patterns 18A and 18B, the RFIC module 14 can be easily and reliably picked up and bonded to the antenna base material 16 provided with the antenna patterns 18A and 18B.

Although the present aspect has been described with reference to the above-described aspects, the aspects of the present disclosure are not limited thereto.

For example, in the case of the above-described aspect, the mounting head 132 of the mounting apparatus 130 in the wireless communication device manufacturing system 100 is what is called a rotary head that mounts a plurality of suction nozzles 134 so as to be able to circle, but the aspect of the present disclosure is not limited thereto. The mounting head according to an aspect of the present disclosure may be a mounting head mounted with one suction nozzle.

In addition, in order to heat the hot melt adhesive layer 42 of the RFIC module 14, any of the heater/heating apparatuses 136, 236, 336, and 436 in the above-described aspects can be combined. For example, the hot melt adhesive layer 42 may be heated by the heating 136 of one aspect to be mounted on the mounting head, and the heating apparatus 236 of another aspect or the heating apparatus 436 of another aspect. In this case, the hot melt adhesive layer 42 is sufficiently heated by the heating apparatus 236 or 436, and the heat escaping from the hot melt adhesive layer 42 before the adhesion of the RFIC module 14 to the material sheet S (antenna base material 16) is completed is compensated by the heating apparatus 136. Accordingly, the heating apparatus 136 to be mounted on the mounting head can be reduced in size.

That is, in a broad sense, an aspect of the present disclosure is a wireless communication device manufacturing system for bonding an RFIC module including an RFIC chip, a terminal electrode, and a hot melt adhesive layer to an antenna base material including an antenna pattern, the wireless communication device manufacturing system including: a mounting apparatus including a mounting head mounted with a suction nozzle that sucks and holds the RFIC module; a conveyance apparatus configured to convey the antenna base material to a mounting position; and a heating apparatus configured to heat the hot melt adhesive layer of the RFIC module. The wireless communication device manufacturing system bonds the RFIC module in a state where the hot melt adhesive layer is softened by heating of the heating apparatus to the antenna base material disposed at the mounting position through the hot melt adhesive layer, and capacitively couples the antenna pattern and the terminal electrode through the hot melt adhesive layer.

The aspects are described above for ease of understanding the present disclosure, and the present disclosure should not be construed as being limitative. The present disclosure can be changed or improved without departing from the gist of the disclosure, and includes equivalents of those changes or improvements. Specifically, each aspect changed in design as appropriate by a person having ordinary skill in the art is also included in the scope of the present disclosure as long as it has any feature of the present disclosure. For example, components in each aspect, the arrangement, material, conditions, shapes, and size of the components are not limited to those exemplarily described and can be changed as appropriate. The components in each aspect can be combined as long as technically feasible, and these combinations are also included in the scope of the present disclosure as long as they have any feature of the present disclosure.

The present disclosure is applicable to manufacturing of a wireless communication device that includes an RFIC module including an RFIC chip, and an antenna.

The invention claimed is:

1. A wireless communication device manufacturing system comprising:
   a mounting apparatus including a mounting head mounted with a plurality of suction nozzles that circle on the mounting head that suck and hold a radio-frequency integrated circuit ("RFIC") module;
   a conveyance apparatus configured to convey an antenna base material to a mounting position; and
   a heating apparatus configured to heat a hot melt adhesive layer of the RFIC module,
   wherein the wireless communication device manufacturing system bonds the RFIC module in a state where the hot melt adhesive layer is softened by heating of the heating apparatus to the antenna base material disposed at the mounting position through the hot melt adhesive layer, and capacitively couples an antenna pattern and a terminal electrode through the hot melt adhesive layer, and
   wherein the heating apparatus is an optical heating apparatus that irradiates the RFIC module with light to heat the hot melt adhesive layer.

2. The wireless communication device manufacturing system according to claim 1, wherein the heating apparatus heats the hot melt adhesive layer of the RFIC module in a state of being held by the plurality of suction nozzles of the mounting head, and
   wherein the mounting head conveys the RFIC module in a state where the hot melt adhesive layer is softened by heating of the heating apparatus to the mounting position, and adheres the RFIC module to the antenna base material disposed at the mounting position through the hot melt adhesive layer in a softened state.

3. The wireless communication device manufacturing system according to claim 1, wherein the optical heating apparatus irradiates the RFIC module in a state of being held by the plurality of suction nozzles of the mounting head with light at a heating position different from the mounting position, and
   wherein the mounting head conveys, to the mounting position, the RFIC module in a state of being heated by irradiation with light at the heating position and where the hot melt adhesive layer being softened.

4. The wireless communication device manufacturing system according to claim 1, further comprising a preheating apparatus configured to preheat the antenna base material disposed at the mounting position.

5. A method of manufacturing a wireless communication device comprising:
- sucking and holding a radio-frequency integrated circuit ("RFIC") module with a plurality of suction nozzles that circle on a mounting head;
- conveying an antenna base material to a mounting position;
- heating a hot melt adhesive layer of the RFIC module with an optical heating apparatus that irradiates the RFIC module with light to heat the hot melt adhesive layer;
- bonding the RFIC module when the hot melt adhesive layer is softened by heating of the optical heating apparatus to the antenna base material disposed at the mounting position through the hot melt adhesive layer, and
- capacitively coupling an antenna pattern and a terminal electrode through the hot melt adhesive layer.

6. The method of claim 5, further comprising preheating the antenna base material disposed at the mounting position.

7. A wireless communication device manufacturing system comprising:
- a mounting head including a plurality of suction nozzles that circle on the mounting head and are configured to hold a radio-frequency integrated circuit ("RFIC") module;
- a conveyance apparatus configured to convey an antenna base material to a mounting position;
- a preheating apparatus configured to preheat the antenna base material disposed at the mounting position; and
- a heater included in the mounting head and configured to heat a hot melt adhesive layer of the RFIC module,
- wherein the heater heats the hot melt adhesive layer of the RFIC module in a state of being held by the plurality of suction nozzle of the mounting head, and
- wherein the heater is an optical heating apparatus that irradiates the RFIC module with light to heat the hot melt adhesive layer.

8. The wireless communication device manufacturing system according to claim 7, wherein the wireless communication device manufacturing system bonds the RFIC module in a state where the hot melt adhesive layer is softened by heating of the heater to the antenna base material disposed at the mounting position through the hot melt adhesive layer.

9. The wireless communication device manufacturing system according to claim 8, where the wireless communication device manufacturing system capacitively couples an antenna pattern and a terminal electrode through the hot melt adhesive layer.

10. The wireless communication device manufacturing system according to claim 7, wherein the mounting head conveys the RFIC module in a state where the hot melt adhesive layer is softened by heating of the heater to the mounting position.

11. The wireless communication device manufacturing system according to claim 10, wherein the wireless communication device manufacturing system adheres the RFIC module to the antenna base material disposed at the mounting position through the hot melt adhesive layer in a softened state.

12. The wireless communication device manufacturing system according to claim 7, wherein the optical heating apparatus irradiates the RFIC module in a state of being held by the plurality of suction nozzles of the mounting head with light at a heating position different from the mounting position, and
- wherein the mounting head conveys, to the mounting position, the RFIC module in a state of being heated by irradiation with light at the heating position and where the hot melt adhesive layer being softened.

* * * * *